United States Patent [19]
Aoki et al.

[11] Patent Number: 5,234,845
[45] Date of Patent: Aug. 10, 1993

[54] METHOD OF MANUFACTURING SEMICONDUCTOR IC USING SELECTIVE POLY AND EPI SILICON GROWTH

[75] Inventors: Atsumi Aoki, Tokyo; Hizuru Yamaguchi, Fussa; Nobuo Owada, Ohme, all of Japan

[73] Assignee: Hitachi, Ltd., Tokyo, Japan

[21] Appl. No.: 859,789

[22] Filed: Mar. 30, 1992

[30] Foreign Application Priority Data

Apr. 12, 1991 [JP] Japan .................................. 3-079624

[51] Int. Cl.$^5$ .................... H01L 21/265; H01L 29/70
[52] U.S. Cl. ..................................... 437/33; 257/518; 437/72; 437/99
[58] Field of Search ........................... 437/33; 257/518

[56] References Cited

U.S. PATENT DOCUMENTS

| | | | |
|---|---|---|---|
| 5,008,210 | 4/1991 | Chiang et al. | 437/33 |
| 5,061,645 | 10/1991 | Nakazato et al. | 437/33 |
| 5,110,757 | 5/1992 | Arst et al. | 437/89 |

OTHER PUBLICATIONS

F. Mieno, et al., "Novel Selective Poly-and Epitaxial-Silicon Growth (SPEG) Technique for ULSI Processing", Session 2.2 of IEDM, 1987, pp. 16-19, 1987 IEEE.

*Primary Examiner*—Olik Chaudhuri
*Assistant Examiner*—Long Pham
*Attorney, Agent, or Firm*—Pennie & Edmonds

[57] ABSTRACT

Herein disclosed is an improved bipolar transistor manufacturing method which adopts an EBT (Epitaxial Base Transistor) structure using an SPESG (Selective Poly-and-Epitaxial-Silicon Growth) technique. Specifically, the method of manufacturing a bipolar transistor according to the present invention comprises the steps of: forming an isolation oxide layer to enclose an active region of a single crystal semiconductor substrate and to have a lower surface than that of the substrate of said active region; simultaneously forming a single crystal silicon layer over the substrate surface of said active region and a polycrystal silicon layer to become integral with said single crystal silicon layer over the surface of said isolation oxide layer by simultaneously growing silicon films over the substrate surface of said active region and the surface of said isolation oxide layer; and forming an active region of a semiconductor element in said single crystal silicon layer.

5 Claims, 9 Drawing Sheets

METHOD OF MANUFACTURING SEMICONDUCTOR IC USING SELECTIVE POLY AND EPI SILICON GROWTH

BACKGROUND OF THE INVENTION

The present invention relates to a method of manufacturing a semiconductor integrated circuit device and, more particularly, to a technology which is effective if applied to a semiconductor integrated circuit device having a bipolar transistor.

On pp. 16 to 19 of SESSION 2. 2 of IEDM, 1987, there is reported a bipolar transistor which adopts the EBT (Epitaxial Base Transistor) structure using an SPESG (Selective Poly-and-Epitaxial-Silicon Growth) technology. The bipolar transistor adopting the EBT structure has its base region formed of a P-type semiconductor region which is deposited over the principal face of an n-type collector region formed in a single crystal semiconductor substrate. With the peripheral of the base region, there is electrically connected a base lead-out layer which is prepared by doping a polycrystalline silicon film highly with a P-type impurity in a high concentration. The base lead-out layer extends over an isolation oxide film (or field insulating film) which is formed over the semiconductor substrate by a LOCOS (Local Oxidation of Silicon) method. Both the base region and the base lead-out layer are formed by using a manufacture process intrinsic to the reported EBT structure and by the same manufacture process. In other words, the base region and the base lead-out layer are simultaneously formed of silicon films which are deposited (or epitaxially grown) over the collector region and the isolation oxide film by a CVD (Chemical Vapor Deposition) method. Of these silicon films, the silicon film deposited over the collector region is formed of a single crystal and used as a base region because the semiconductor substrate where the collector region is formed is made of a single crystal. On the other hand, the silicon film deposited over the isolation oxide film is formed of a polycrystal and used as the base lead-out layer because the isolation oxide film is not made of a single crystal but is amorphous. The emitter region of the bipolar transistor is formed of an n-type semiconductor region which is prepared by doping the principal face of the base region selectively with an n-type impurity. The bipolar transistor adopting this EBT structure can have a shallow base region junction to operate at a high speed because the junction depth of the base region can be set by the thickness of the single crystal silicon film deposited on the collector region. Since, moreover, the base region can be formed in a self-alignment manner with the collector region, the bipolar transistor can be highly integrated with the result that the semiconductor integrated circuit device having the bipolar transistor can be highly integrated.

SUMMARY OF THE INVENTION

We have investigated the technology for simultaneously forming the monocrystalline/polycrystalline silicon films from the standpoint of high integration of the bipolar transistor adopting the aforementioned EBT structure and have revealed the following problems. In the prior art described above, at the time of forming the monocrystaline/polycrystalline silicon films, the isolation oxide film serving as the underlying structure is a LOCOS oxide film which is prepared by oxidizing the principal face of the semiconductor substrate. As a result, the polycrystal silicon to be used as the base lead-out layer is grown with a gradient toward an active region (i.e., the single crystal region) by the step which arises from the LOCOS oxide film. As shown in FIG. 18, more specifically, a LOCOS oxide film 3 is so formed over the principal face of a single crystal semiconductor substrate as to enclose an active region, and a polycrystal silicon layer 4B to act as the aforementioned base lead-out layer grows along a slope extending from a bird's head BH to a bird's beak BB of the LOCOS oxide film 3. As a result, the polycrystalline silicon layer 4B grows with a gradient toward a single crystal silicon layer 4A by an angle $\theta$ which is made between the slope of the LOCOS oxide film 3 and the upper face of the active region. As a result, there is established a difference between the width 11 of the active region (i.e., the width of the lower face of the single crystal silicon layer 4A), which is specified by the pattern of the LOCOS oxide film at first, and the width 12 of the active region (i.e., the width of the upper face of the single crystal silicon layer 4A) after the monocrystalline/polycrystalline silicon layers have been formed. In other words, the relation of $11 > 12$ holds, so that the effective area of the active region is reduced by the shaded region shown in the top plan view of FIG. 19. This makes it necessary to widen the opening pattern of the LOCOS oxide film 3 in advance in the case that a desired single crystal region (or active region) is to be formed by making use of the technology of forming the monocrystalline/polycrystalline silicon films simultaneously. Thus, there arises a problem that the degree of integration of the semiconductor integrated circuit device drops. Since, moreover, the opening pattern of the LOCOS oxide film has to be widened, the PN junction capacitance between the single crystal silicon layer 4A acting as the base region and an n-type collector region 2 formed over the principal face of the semiconductor substrate 1 is increased to raise another problem that the operating speed of the semiconductor integrated circuit device having the bipolar transistor drops. Since, furthermore, the area for the principal face (or upper face) of the single crystal silicon layer acting as the base region decreases, the masking margin for forming the emitter region 5 of the bipolar transistor is reduced to raise still another problem that the production yield of the semiconductor integrated circuit device having a bipolar transistor drops.

The present invention has been conceived to solve the above-mentioned problems and has an object to provide a technology capable of highly integrating a semiconductor integrated circuit device which is manufactured by making use of the technology for forming monocrystalline/polycrystalline silicon films simultaneously.

Another object of the present invention is to provide a technology capable speeding up the semiconductor integrated circuit device which has a bipolar transistor manufactured by making use of the technology for forming monocrystalline/polycrystalline silicon films simultaneously.

Still another object of the present invention is to provide a manufacture method capable of improving the production yield of a semiconductor integrated circuit device having a bipolar transistor.

The representative of the invention to be disclosed herein will be briefly summarized in the following.

According to the present invention, there is provided a method of manufacturing a semiconductor integrated circuit device, comprising the steps of: forming an isolation oxide layer to enclose an active region of a single crystal semiconductor substrate and to have a lower surface than that of the substrate of the active region; simultaneously forming a single crystal silicon layer over the substrate surface of the active region and a polycrystal silicon layer to become integral with the single crystal silicon layer over the surface of the isolation oxide layer by simultaneously forming silicon films over the substrate surface of the active region and the surface of the isolation oxide layer; and forming an active region of the bipolar transistor and forming said polycrystal silicon layer into a lead-out layer of the active region.

In brevity, the gist of the present invention resides in that, when monocrystalline/polycrystalline silicon films are simultaneously formed on the principal face of the single crystal silicon layer (i.e., the active region) serving as an underlying layer and the isolation oxide layer (i.e., the inactive region) enclosing the single crystal silicon layer, the growing direction of the single crystal silicon layer to be simultaneously formed is extended to the isolation oxide region by lowering the surface of the isolation oxide region in advance below the surface of the single crystal silicon region, thereby to ensure a wide area of the single crystal silicon layer serving as an element forming region.

According to the aforementioned gist of the present invention, the surface of the isolation oxide layer is lower than that of the substrate, the growing direction of the polycrystal silicon layer formed over the isolation oxide layer is outside the active region, so that the area of the upper face of the single crystal silicon layer formed over the active region is larger than the area of the opening restricted by the isolation oxide layer. As a result, the area of the opening can be reduced to an extent of the enlarged area, so that the semiconductor integrated circuit device can be highly integrated.

DESCRIPTION OF THE PREFERRED EMBODIMENT

A method of manufacturing a semiconductor integrated circuit device having a bipolar transistor, of an embodiment of the present invention, will be described in the following with reference to FIGS. 1 to 16.

Figure 1:
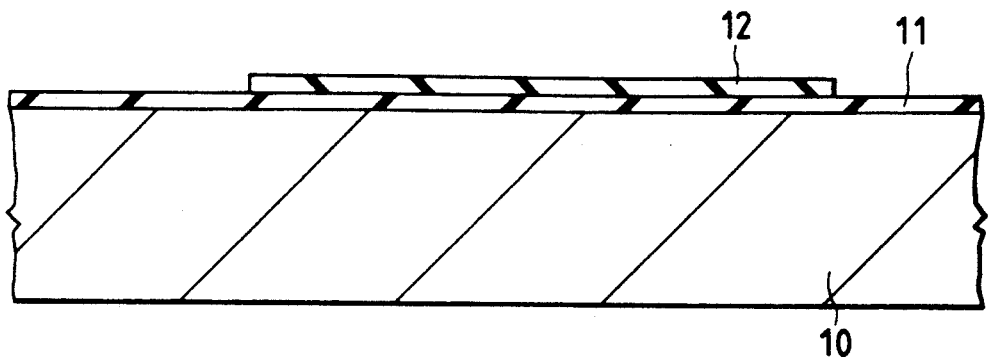
FIGS. 1 to 16 are sections of essential portions and show a method of manufacturing a semiconductor integrated circuit device having bipolar transistors according to the present invention in the order of the manufacturing steps.

First of all, there is prepared a $P^-$-type semiconductor substrate 10 made of single crystal silicon, as shown in FIG. 1. The $P^-$-type semiconductor substrate 10 to be used desirably has its element forming face of a crystal orientation (100) or (111) and a discrepancy of plus/-minus one degree from the crystal orientation. Next, the substrate 10 has its surface formed with a silicon oxide film 11 and a silicon nitride film 12 acting as an oxidation impermeable mask. The silicon oxide film 11 is formed by thermally oxidizing the surface of the substrate 10, for example, and the silicon nitride film 12 is formed by a CVD (Chemical Vapor Dposition) method, for example, and is patterned by an ordinary photolithography or etching technique.

Figure 2:
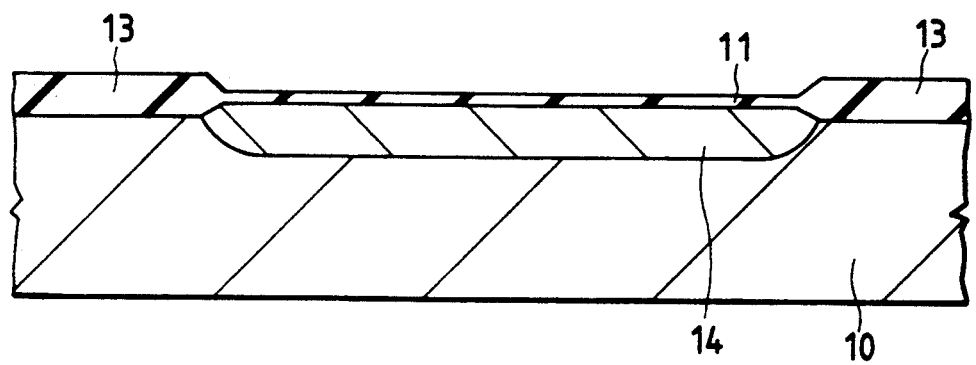

Next, the surface of the substrate 10 exposed from the silicon nitride film 12 is thermally oxidized to form a relatively thick silicon oxide film 13, as shown in FIG. 2. After this, the silicon nitride film 12 as the oxidation impermeable mask is removed. Next, an n-type impurity is selectively introduced into the principal face of the substrate 10 using the silicon oxide film 13 as an impurity doping mask. After this, a highly doped collector region 14 of an $n^+$-type semiconductor region of the bipolar transistor is formed by an enlarged diffusion such as a heat treatment of the n-type impurity. The n-type impurity to be employed is exemplified by antimony (Sb) or arsenic (As) of high concentration and is introduced by an ion implantation method or thermal diffusion method, for example. Next, the silicon oxide films 11 and 13 are removed by using an etching liquid such as hydrofluoric acid.

Figure 3:
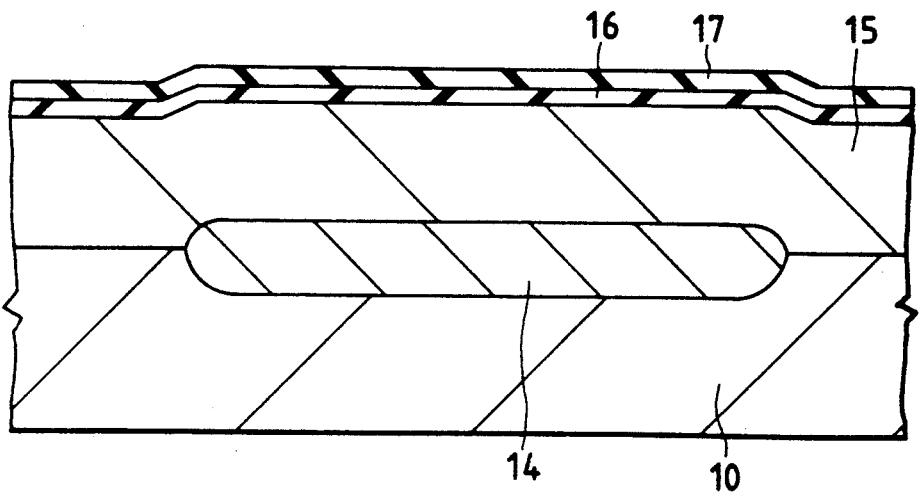

Next, as shown in FIG. 3, an epitaxial layer 15 of $n^-$-type single crystal silicon is formed over the substrate 10 including the highly doped collector region 14. The expitaxial layer 15 is formed to have a thickness of about 1.0 [μm], for example. Next, a silicon oxide film 16 and a silicon nitride film 17 are formed in order on the principal face of the epitaxial layer 15. The silicon oxide film 16 is formed by thermally oxidizing the surface of the epitaxial layer 15, for example, and the silicon nitride film 17 is formed by a CVD method, for example.

Figure 4:
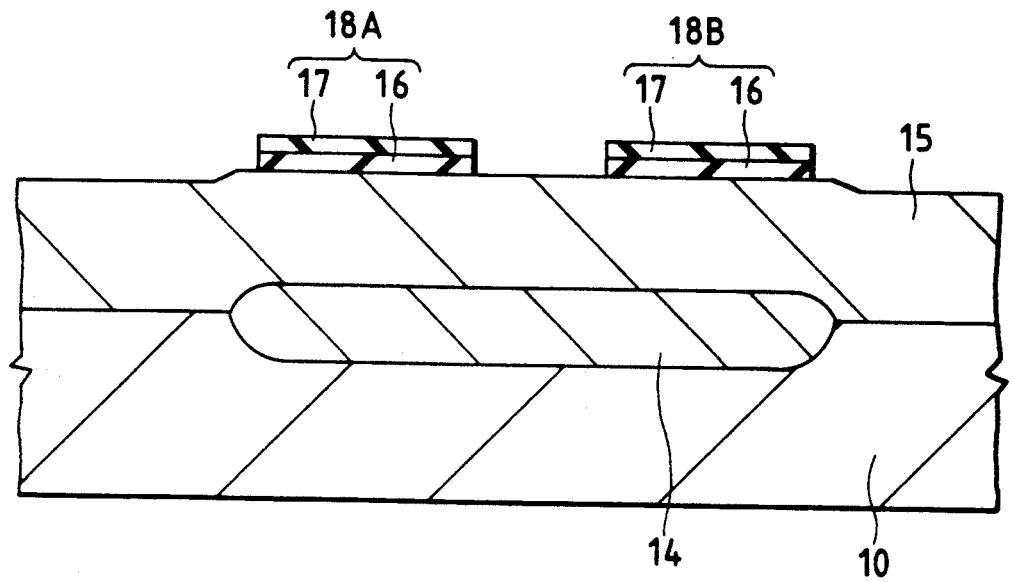
Figure 5:
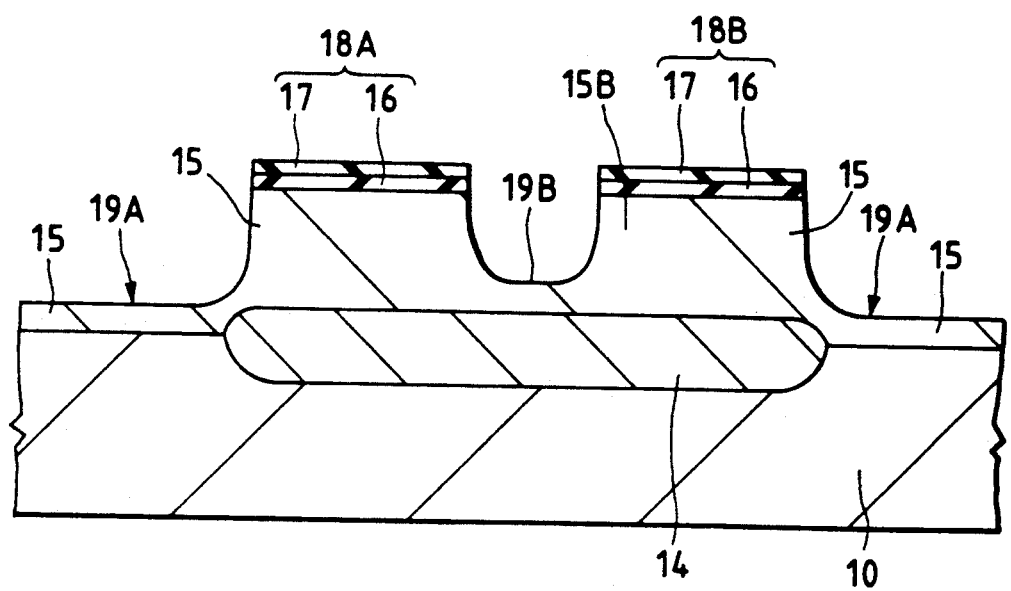

Next, as shown in FIG. 4, a mask 18A and a mask 18B for etching the epitaxial layer 15 selectively are formed by patterning the silicon nitride film 17 and the silicon oxide film 16 in order by an ordinary photolithography and etching techniques. The mask 18A covers the principal face of the epitaxial layer 15 in the regions in which the emitter region, base region and intrinsic collector region of the bipolar transistor are to be formed, and the mask 18B covers the principal face of the epitaxial layer 15 in the regions where the collector lead-out region of the bipolar transistor are to be formed. Next, as shown in FIG. 5, the epitaxial layer 15 exposed from the masks 18A and 18B is etched to form trenches 19A and 19B for isolations. The etching method used is an anisotropic etching such as a RIE (Reactive Ion Etching) method. By forming these trenches 19A and 19B, protruding island regions 15A and 15B of silicon are formed on the principal face of the substrate 10.

Figure 6:
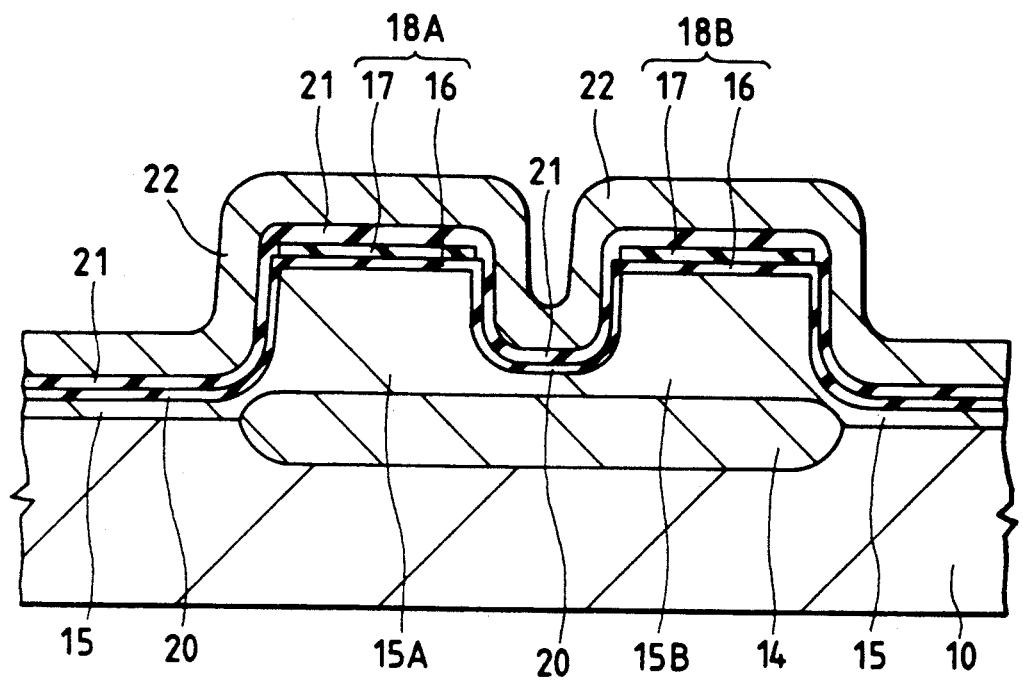

Next, as shown in FIG. 6, the surface of the epitaxial layer 15 exposed from the masks 18A and 18B is thermally oxidized to form a silicon oxide film 20. After this, all over the substrate 10, there are deposited in order a silicon nitride film 21 and a polycrystal silicon layer 22. These silicon nitride film 21 and the polycrystal silicon layer 22 are individually formed by a CVD method.

Figure 7:
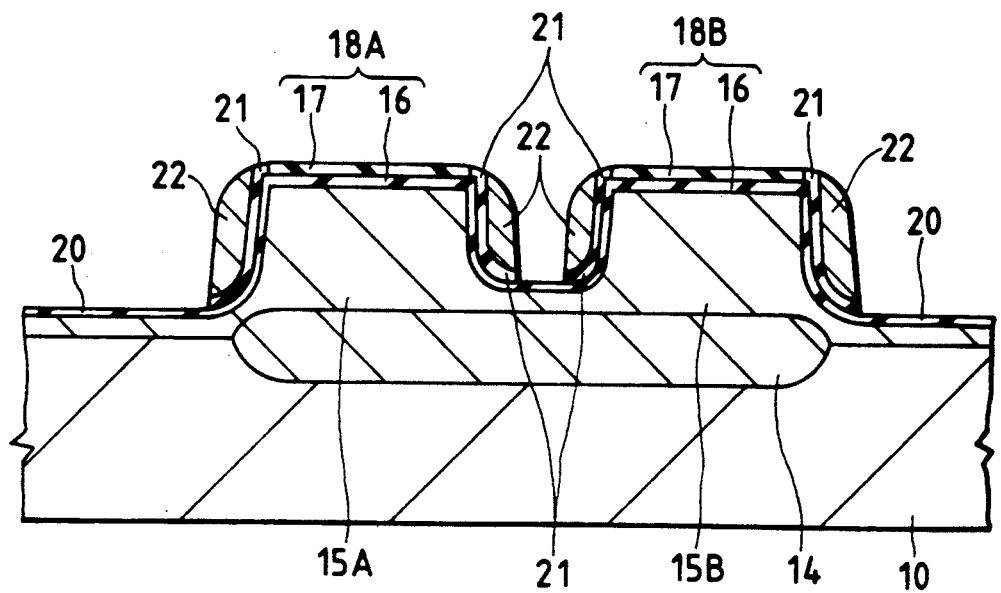

Next, as shown in FIG. 7, an etch back is accomplished by an anisotropic etching method to an extent of the deposited thickness of the polycrystal silicon layer 22 and the silicon nitride film 21, to leave the polycrystal silicon layer 22 and the silicon nitride film 21 selectively at the sides of the epitaxial layer 15 (i.e., the sides of the protruding island regions 15A and 15B). After this, only the polycrystal silicon layer 22 left at the sides is removed by a wet etching method, for example.

Figure 8:
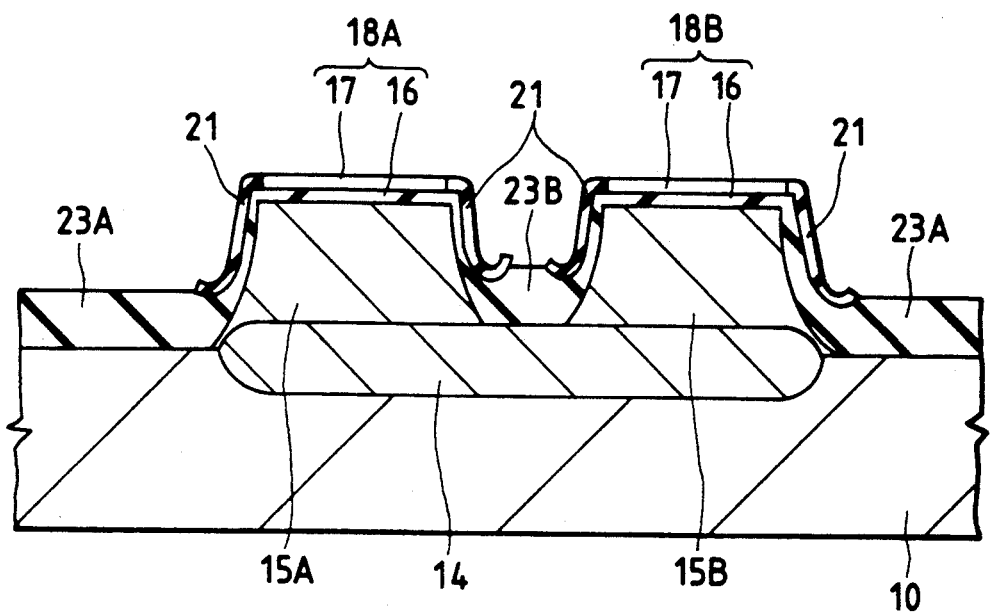

Next, as shown in FIG. 8, the surface of the epitaxial layer 15 exposed from the silicon nitride film 21 and the masks 18A and 18B left at the sides of the protruding island regions 15A and 15B is thermally oxidized to form isolation oxide layers (or field insulating films) 23A and 23B made of silicon oxide films. The isolation oxide layers 23A and 23B are formed to enclose the protruding island regions 15A and 15B and to have a thickness of 1.0 [μm]. On the other hand, the lower portion of the isolation oxide layer 23A reaches the principal face of the P$^-$-type semiconductor substrate 10 to electrically isolate the protruding island regions 15A and 15B, where the active region of the bipolar transistor is formed, from the epitaxial layer 15 on another substrate 15. The isolation oxide layer 23B is formed to isolate the base region of the bipolar transistor and the collector lead-out region.

Figure 9:
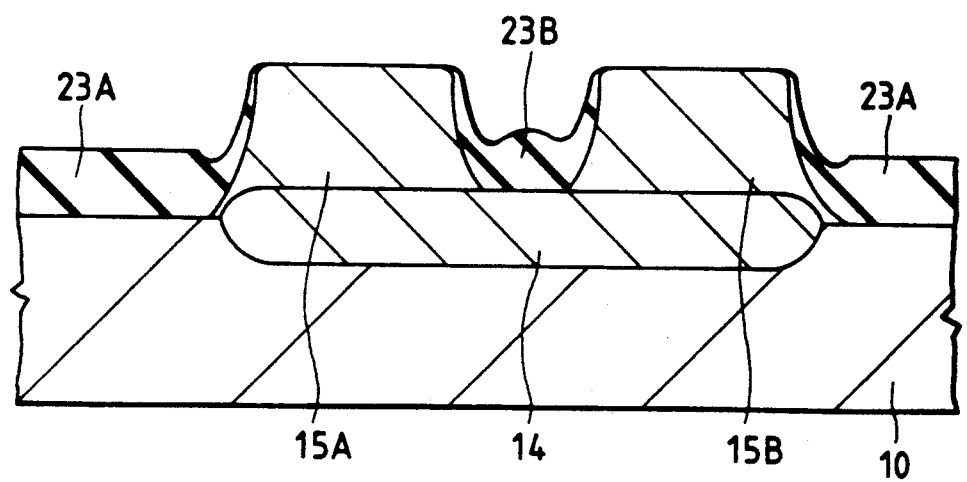

Next, as shown in FIG. 9, the silicon nitride films 21 and 17 and the silicon oxide film 16 are removed in order by a wet etching, for example, to expose the surface of the silicon surface of the protruding island regions 15A and 15B. The isolation oxide layer is so formed by the steps thus far described as to have a lower face than the principal faces of the protruding island regions (or active regions).

Figure 10:
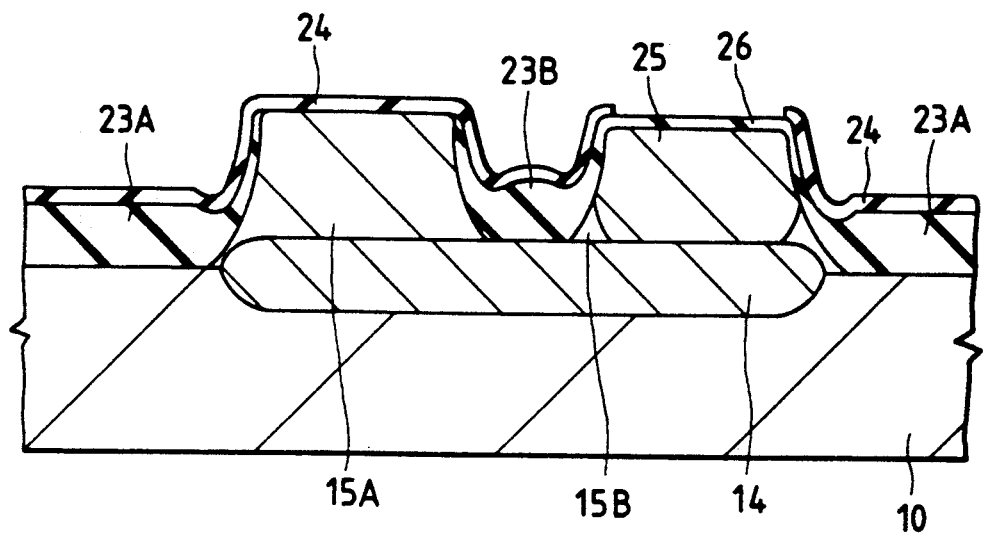

Next, as shown in FIG. 10, there is formed a mask 24 of a silicon nitride film for opening the principal face of the protruding island region 15B. This mask 24 is formed by a CVD method, for example, and is patterned by ordinary photolithography and etching techniques. Next, by using the mask 24 as an impurity introducing mask, the principal face highly of the protruding island region 15B is doped with an n-type impurity such as phosphor (P) by an ion implantation method. Next, a collector lead-out region 25 made of n$^+$-type semiconductor region is formed by thermally processing the introduced n-type impurity. The collector lead-out region 25 is so formed that its bottom is in contact with the highly doped collector region 14.

Next, on the principal face of the collector lead-out region 25, an insulating film 26 is formed. This insulating film 26 is a silicon oxide film which is formed by thermally oxidizing the silicon surface exposed from the mask 24. After this, the mask 24 is removed by a wet etching, for example, to expose the surface of the protruding island region 15A again to the outside.

Figure 18:
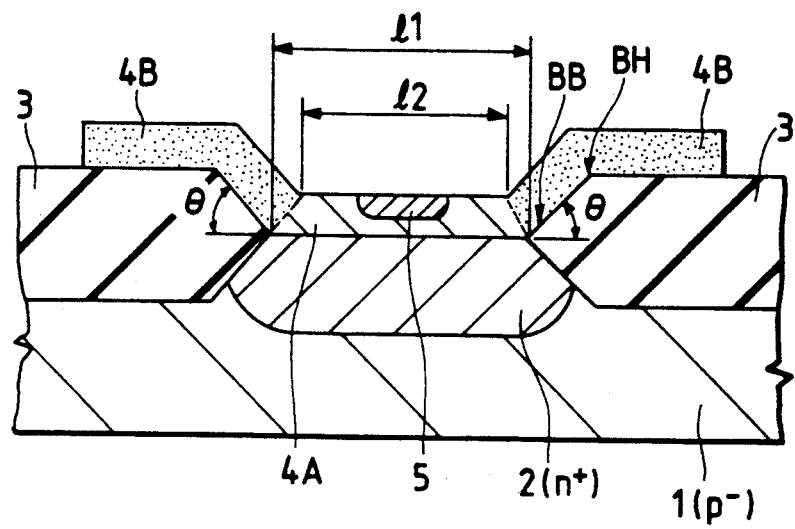
FIG. 18 is a section showing an essential portion of the bipolar transistor which has been manufactured by a conventional method.
Figure 19:
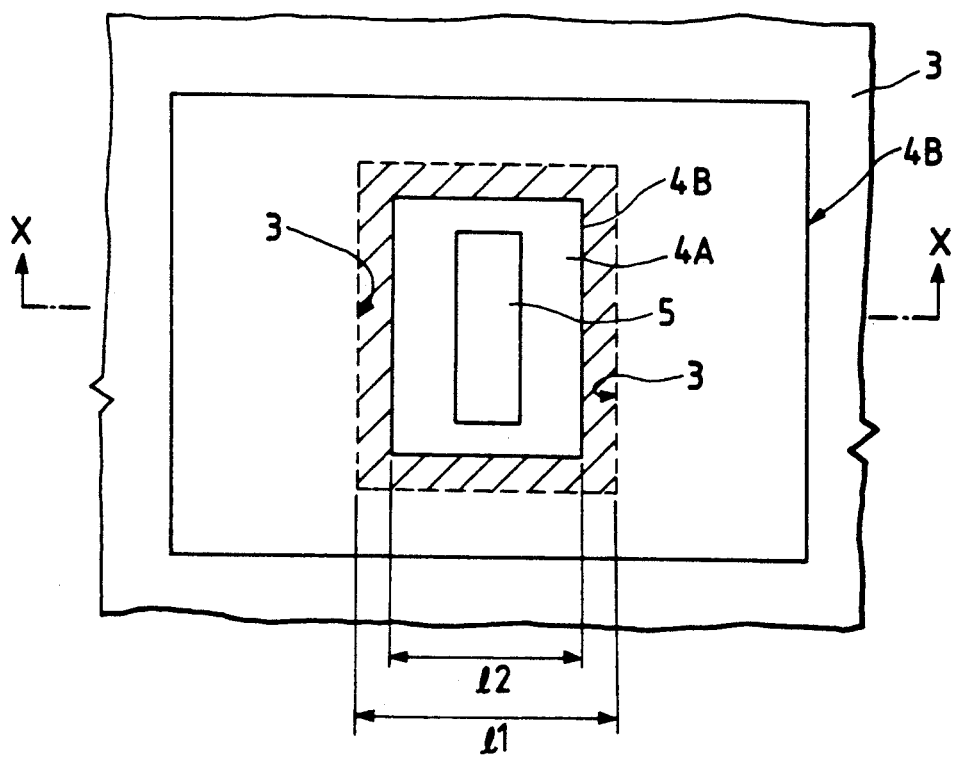
FIG. 19 is a top plan view corresponding to the bipolar transistor shown in FIG. 18.

Next, the whole surface of the substrate 10 including the surfaces of the isolation oxide layers 23A and 23B and the protruding island regions (or active regions) 15A and 15B, a silicon layer 27 is formed. This silicon layer 27 is deposited by a CVD method using monosilane gas (SiH$_4$) as source gas, for example. According to this CVD method, the SiH$_4$ gas is decomposed under a normal pressure at a high temperature of about 1,000 [° C.], for example, to deposit the silicon in a manner of corresponding to the underlying crystal. In other words, the silicon layer 27 deposited over the protruding island region 15A is deposited epitaxially grown as a single crystal silicon layer 27A because the protruding island region 15A is formed of the single crystal silicon layer. On the other hand, the silicon layer deposited over the isolation oxide layers 23A and 23B and the insulating film 26 is deposited as a polycrystal silicon layer 27B because the isolation oxide layers 23A and 23B and the insulating film 26 are not single crystals but amorphous. Since the silicon layer 27A is used as the intrinsic collector region of the bipolar transistor, the silicon layer 27 is basically formed under a condition that the silicon layer 27 is lightly doped with n-type impurity or not doped with any n- or p-type impurity, namely under an intrinsic condition. The introduction of the n-type impurity into the silicon layer 27 is accomplished during or after the deposition of the silicon layer 27 by an ion implantation or thermal diffusion method. The silicon layer 27 is formed to have a thickness of 1.0 [μm], for example. What is noted here is that the single crystal silicon layer 27A is formed to the outside of the protruding island region 15A, as indicated by a dotted line 27C in the same Figure. The reason will be described in the following. Since the isolation oxide layers 23A and 23B are formed in lower positions than the surface of the protruding island region 15A, the slope extending from the bird's head BH to the bird's beak BB, as described with reference to FIGS. 18 and 19, is directed not to the active region (i.e., the protruding island region) but to the outside of the active region. As a result, the principal face of the single crystal silicon layer 27A can be formed wider than that of the underlying protruding island region 15A.

Figure 12:
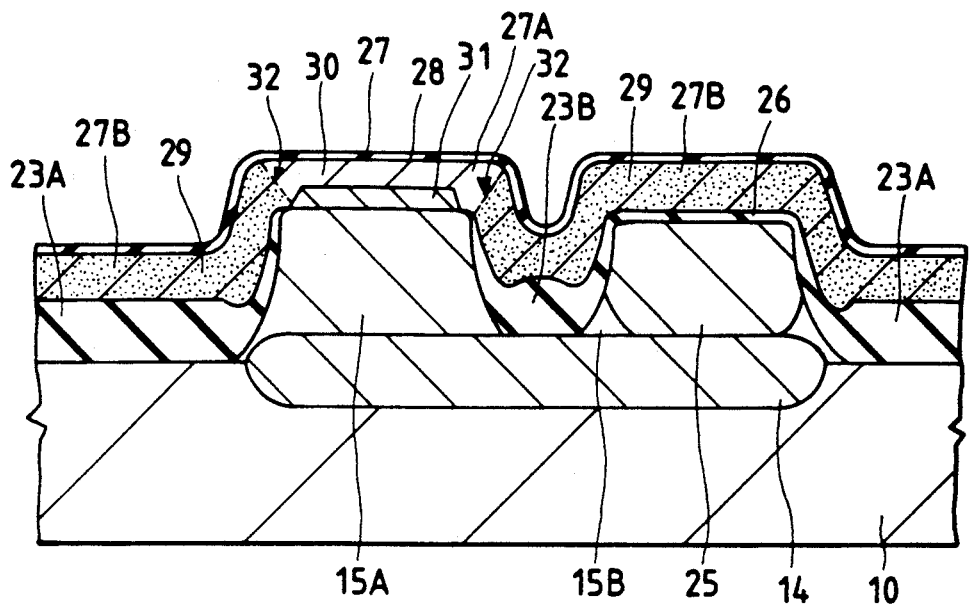

Next, as shown in FIG. 12, a thin silicon oxide film 28 is formed over the surface of the silicon layer 27 by a thermal oxidation method, for example After this, the polycrystal region (27B) of the silicon layer 27 is highly doped with a P-type impurity such as boron (B) to form a base lead-out layer 29 of the bipolar transistor. The P-type impurity to be introduced into the polycrystal silicon layer 27B is of the grain diffusion type and has a higher diffusion velocity than the single crystal silicon layer 27A. In other words, in the base lead-out layer 29 (or the polycrystal silicon layer 27B) the P-type impurity can be diffused, which reduces the resistance even if the base lead-out layer 29 is thick. The introduction of the P-type impurity is performed by using an impurity introduction mask (e.g., a photo resist film) formed over the single crystal silicon layer 27A by photolithography and etching techniques, for example, and by an ion implantation or thermal diffusion method. After this, the impurity introduction mask is removed. Next, the principal face of the silicon layer 27 is doped with a P-type impurity such as boron (B) and is then subjected to a heat treatment to form an intrinsic base region 30 of a P-type semiconductor region of the bipolar transistor in the single crystal silicon layer 27A. As a result of the heat treatment, moreover, the P-type impurity introduced into the polycrystal silicon layer 27B diffused into the sides of the single crystal silicon layer 27A to form an extrinsic base region 32 of a P$^+$-type semiconductor region of the bipolar transistor. The intrinsic base region 30, the extrinsic base region 32 and the base lead-out layer 29 are individually formed of P-type semiconductor and are electrically connected. Of the single crystal silicon layer 27A, moreover, the lower portion of the intrinsic base region 30 is left as it is as an n-type single crystal silicon and used as the intrinsic collector region 31 of the bipolar transistor.

Figure 13:
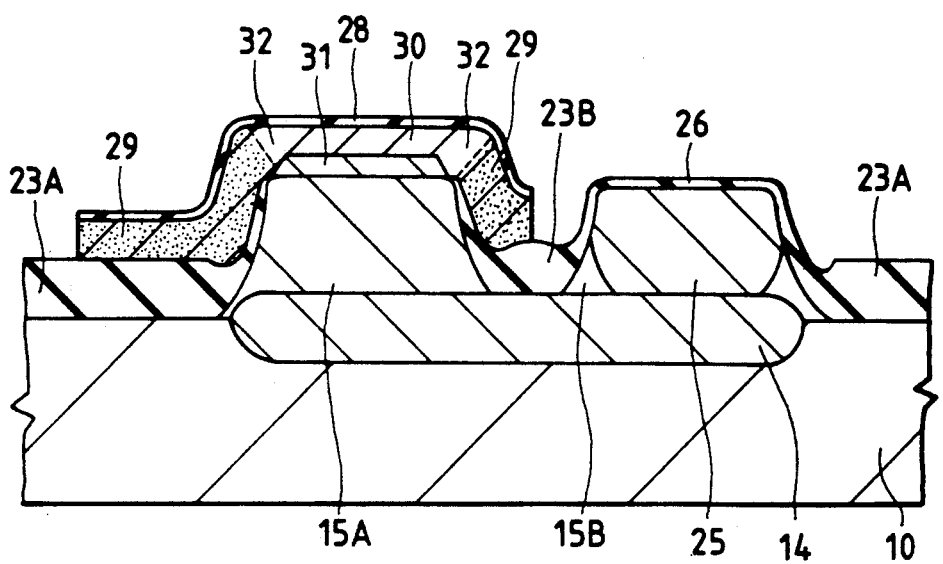

Next, as shown in FIG. 13, the unnecessary portion of the polycrystal silicon layer 27B is removed by anisotropic etching such as RIE to structure the base lead-out layer 29. The patterning of the polycrystal silicon layer 27B is accomplished by using the photoresist mask which is formed by ordinary photolithography and etching techniques. The base lead-out layer 29 is structured to enclose the intrinsic base region 30 which is formed in the single crystal silicon layer 27A.

Figure 14:
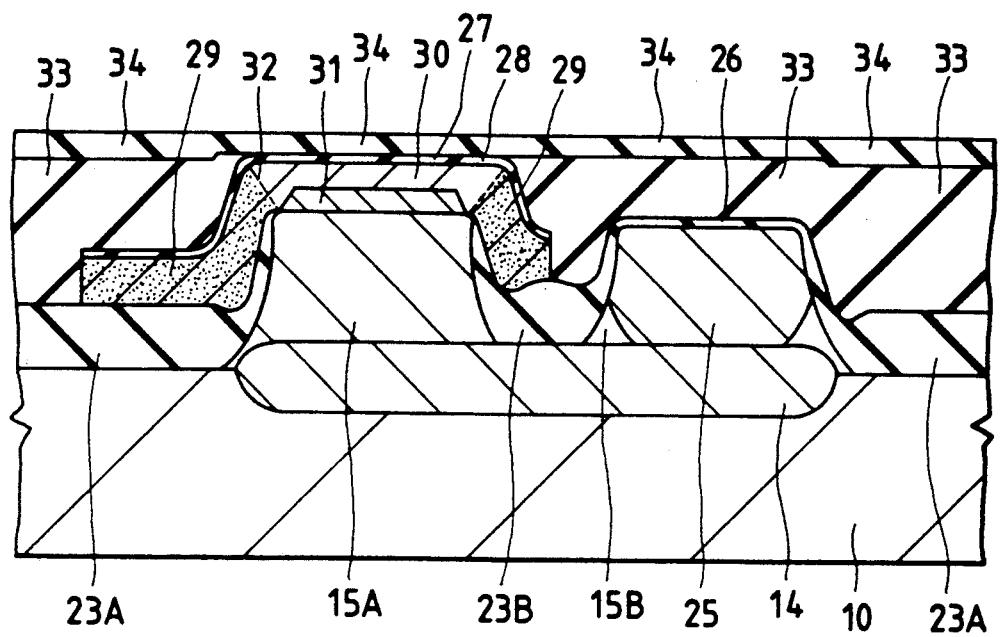

Next, as shown in FIG. 14, a flattening insulating layer 33 is formed to reduce the step which arises from the base lead-out layer 29 and the isolation trenches 19A and 19B. The insulating layer 33 can be selectively formed in the recess of the substrate 10, by depositing a silicon oxide film all over the substrate 10 by a CVD method, for example, till the recess of the substrate 10 is filled in, subsequently by flattening the silicon oxide film by a resist application or the like, and by etching back to an extent corresponding to the thickness of the silicon oxide deposited by the foregoing anisotropic etching such as RIE. Next, an insulating film 34 is formed over the insulating layer 33 and the silicon layer 27. The insulating film 34 is of a silicon oxide film which is deposited by a CVD method, for example.

Figure 15:
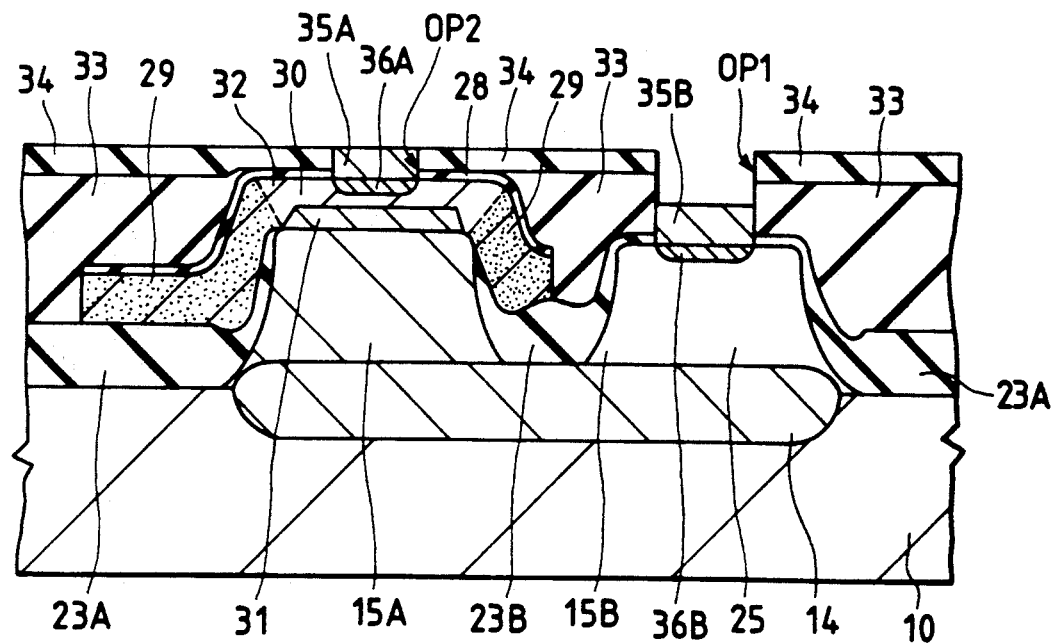

Next, as shown in FIG. 15, in the insulating films 34, 33 and 26 over the collector lead-out region 25 is formed an opening OP1 reaching the principal face of the collector lead-out region 25; in the insulating films 34 and 28 over the intrinsic base region 30 is formed an opening OP2 reaching the principal face of the intrinsic base region 30. These openings OP1 and OP2 are formed by anisotropic etching such as RIE which uses a photoresist mask formed by an ordinary photolithography technique as an etching mask. Since the insulating films over the collector lead-out region 25 and the intrinsic base region 30 have different thicknesses, the openings OP1 and OP2 are individually formed by different photolithography and etching techniques. Next, a collector lead-out layer 35B and an emitter lead-out layer 35A of polycrystal silicon films are individually formed in the openings OP1 and OP2. The aforementioned CVD technique is one capable of depositing polycrystal silicon films selectively over the exposed silicon faces of the collector lead-out region 25 and the intrinsic base region 30, for example, a CVD technique using $SiH_4$ as its source gas. The formation of the polycrystal silicon films (35A and 35B) may be done by an ordinary CVD technique, in which the polycrystal silicon films can be deposited all over the substrate 10 including the opening OP1 and OP2 and are then patterned by ordinary photolithography and etching techniques. Next, the emitter lead-out layer 35A and the collector lead-out layer 35B are doped with an n-type impurity such as arsenic to reduce the resistances of the individual lead-out layers 35A and 35B. After this, the n-type impurity introduced into the individual lead-out layers 35A and 35B is subjected to a drive-in-diffusion into the intrinsic base region 30 and the collector lead-out region 25 to form an emitter region 36A and a collector contact region 36B of a bipolar transistor of the $n^+$-type semiconductor region.

Figure 16:
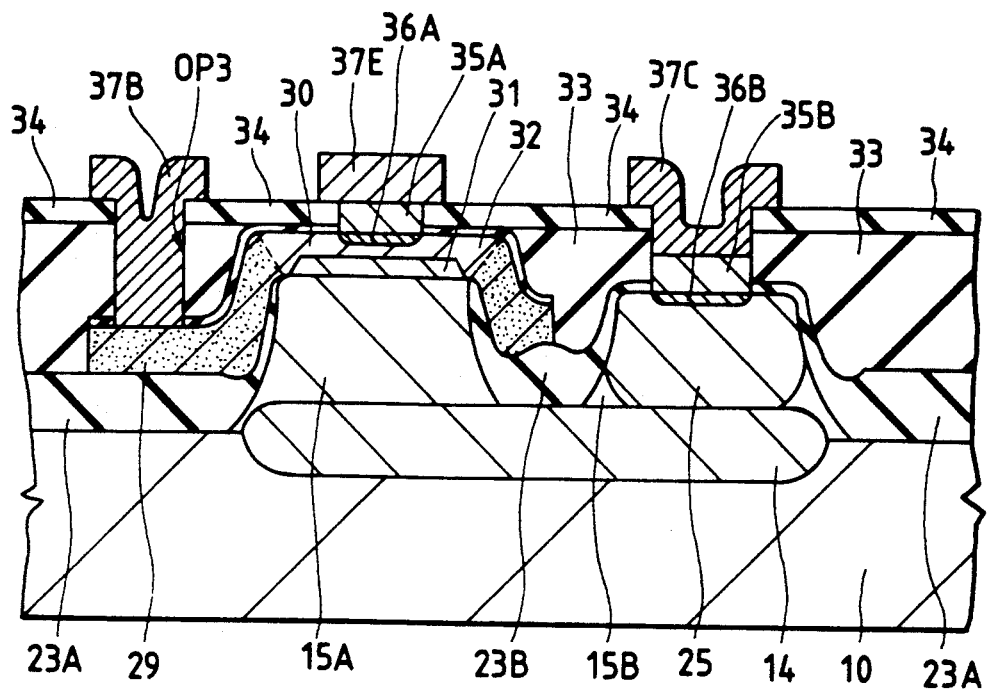

Next, as shown in FIG. 16, in the insulating films 34, 33 and 28 over the base lead-out layer 29 is formed an opening OP3 reaching the principal face of the base lead-out layer 29. This opening OP3 is formed by etching the insulating films 34, 33 and 28 sequentially by ordinary photolithography and etching techniques. Next, an emitter wiring layer 37E, a base wiring layer 37B and a collector wiring layer 37C made of an aluminum layer or alloy layer over the openings OP1, OP2 and OP3 are formed by depositing aluminum or its alloy layer all over the substrate 10 by a sputtering method, for example, and subsequently by patterning it by ordinary photolithography and etching techniques. By repeating the steps thus far described, a semiconductor integrated circuit device having the bipolar transistor of the embodiment of the present invention is substantially completed.

Figure 17:
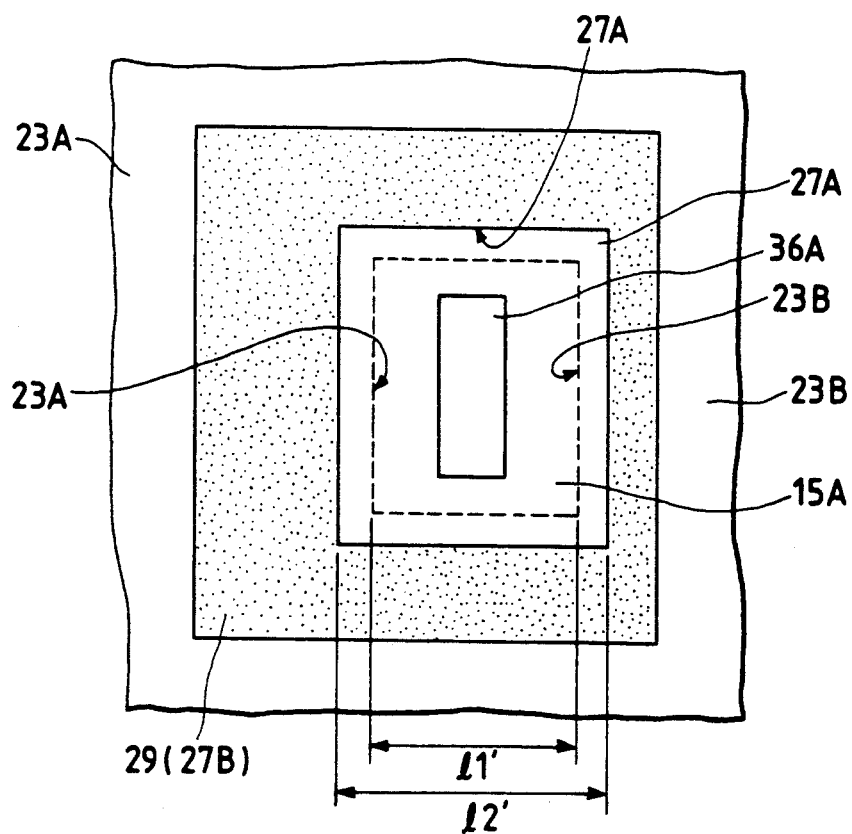
FIG. 17 is a top plan view showing an essential portion near the active region of the bipolar transistor of the present invention.

Thus, according to the manufacturing method of the present invention, as shown in FIG. 17 (a top plan view showing an essential portion of the bipolar transistor of the present invention), the width 12' of the single crystal silicon layer 27A where active regions such as the emitter region 36A and the base region 30 of the bipolar transistor are formed can be made larger than the width 11' of the active region (e.g., the principal face of the single crystal silicon layer 15A) restricted by the isolating isolation oxide layers 23A and 23B. As a result, the area of the active region restricted by the isolating isolation oxide layers can be made small in advance to integrate semiconductor integrated circuit device highly. Moreover, the width 11' of the principal face of the single crystal silicon layer (e.g., the n-type epitaxial layer 15A) which is to be the collector region of the bipolar transistor can be small to reduce the base-collector parasitic capacitance of the bipolar transistor. As a result, the semiconductor integrated circuit device having the bipolar transistor can operate at high speed. Moreover, when the area of the active region restricted by the isolating isolation oxide layer is made equal to that of the prior art, the area of the single crystal silicon layer 27A where the base region is formed can be made larger than that of the prior art, so that the masking margin for forming the emitter can be enlarged. As a result, the production yield of the semiconductor integrated circuit device having bipolar transistors can be improved.

Although our invention has been specifically described in connection with the embodiment thereof, it should not be limited thereto but can naturally be modified in various manners without departing from the gist thereof.

Figure 11:
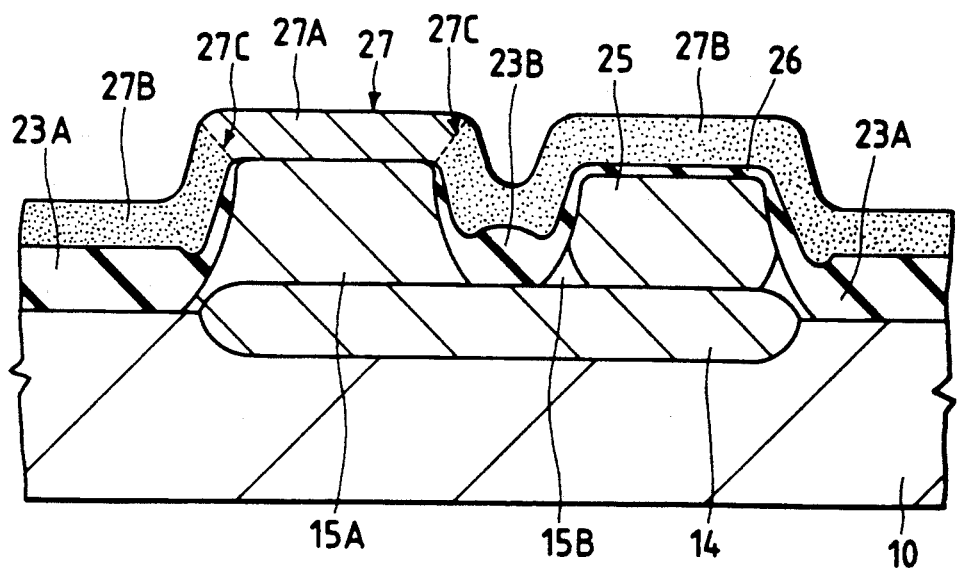

For example, in the foregoing embodiment, as shown in FIGS. 11 to 13, the base lead-out layer 29 and the intrinsic base region 30 are individually formed by forming the single crystal silicon layer 27 and the polycrystal silicon layer 27B of the n-type at first and then by doping the individual silicon layers 27A and 27B with the P-type impurity. However, the single crystal silicon layer 27A and the polycrystal silicon layer 27B may be made of the P-type in advance. In this case, the P-type impurity concentration of the single crystal silicon layer 27A may be set in advance equal to that of the intrinsic base region of the bipolar transistor, and then the polycrystal silicon layer 27B used as the base lead-out layer 29 may be heavily doped with the P-type impurity. According to this modified manufacturing method, the intrinsic collector region 31 shown in FIG. 13 becomes the P-type intrinsic base region, so that the substantially intrinsic collector region becomes the epitaxial layer 15A. According to the foregoing embodiment, moreover, the P-type impurity introduction for forming the intrinsic base region 30 can be omitted to reduce the process cost.

Moreover, the present invention can be applied to a mixed type semiconductor integrated circuit device having a bipolar transistor and a MOSFET. In this case, the bipolar transistor may be formed as in the foregoing embodiment, but the MOSFET may be formed by constructing the base lead-out layer 29 as the source/drain regions, by forming the principal face of the single crystal silicon layer 27A as the channel region, and by forming the gate insulating film and the gate electrode over the single crystal silicon layer 27A by a well-known method.

What is claimed is:

1. A method of manufacturing a semiconductor integrated circuit device having a bipolar transistor, comprising the steps of: forming an isolation oxide layer to enclose an active region of a single crystal semiconductor substrate and to have a lower surface than that of the substrate of said active region; simultaneously forming a single crystal silicon layer over the substrate surface of said active region and a polycrystal silicon layer to become integral with said single crystal silicon layer over the surface of said isolation oxide layer by simultaneously growing silicon films over the substrate surface of said active region and the surface of said isolation oxide layer; and forming an operative region of said bipolar transistor in said single crystal silicon layer and turning said polycrystal silicon layer into a lead-out layer of said operative region.

2. A method according to claim 1, wherein the step of forming the operative region of said bipolar transistor includes the sub-steps of: forming a base region of a first conductivity type by doping said single crystal silicon layer with an impurity of the first conductivity type; and forming an emitter region of a second conductivity type by doping the principal face of said base region with an impurity of the second conduction type.

3. A method according to claim 2, wherein the step of turning said polycrystal silicon layer into the lead-out layer of said operative region includes the sub-steps of: forming a base lead-out layer by doping said polycrystal silicon layer with an impurity of the first conductivity type; and connecting said base lead-out layer electrically with said base region of the first conductivity type.

4. A method according to claim 1, wherein the step of forming said isolation oxide layer includes the sub-steps of: etching the principal face of said single crystal semiconductor substrate in a manner of enclosing the active region of said single crystal semiconductor substrate; and thermally oxidizing the surface of the etched single crystal semiconductor substrate selectively.

5. A method of manufacturing a semiconductor integrated circuit device having a bipolar transistor, comprising the steps of: forming an isolation oxide layer to enclose an active region of a single crystal semiconductor substrate and to have a lower surface than that of the substrate of said active region; simultaneously forming a single crystal silicon layer over the substrate surface of said active region and a polycrystal silicon layer to become integral with said single crystal silicon layer over the surface of said isolation oxide layer by simultaneously growing silicon films over the substrate surface of said active region and the surface of said isolation oxide layer; and forming an active region of a semiconductor element in said single crystal silicon layer.

* * * * *